United States Patent
Ricchetti et al.

(10) Patent No.: US 6,957,371 B2
(45) Date of Patent: Oct. 18, 2005

(54) METHOD AND APPARATUS FOR EMBEDDED BUILT-IN SELF-TEST (BIST) OF ELECTRONIC CIRCUITS AND SYSTEMS

(75) Inventors: Michael Ricchetti, Nashua, NH (US); Christopher J. Clark, Durham, NH (US)

(73) Assignee: Intellitech Corporation, Durham, NH (US)

(*) Notice: Subject to any disclaimer, the term of this patent is extended or adjusted under 35 U.S.C. 154(b) by 83 days.

(21) Appl. No.: 10/142,556

(22) Filed: May 10, 2002

(65) Prior Publication Data

US 2003/0106004 A1 Jun. 5, 2003

Related U.S. Application Data

(60) Provisional application No. 60/336,586, filed on Dec. 4, 2001.

(51) Int. Cl.[7] .............................................. G01R 31/28
(52) U.S. Cl. ...................... 714/733; 714/724; 714/735; 714/726; 365/201
(58) Field of Search ................................ 714/733, 724, 714/699, 718, 100, 25, 30, 32, 37, 40, 726, 738, 735, 736, 727, 20; 365/201, 233; 711/206

(56) References Cited

U.S. PATENT DOCUMENTS

| | | | |
|---|---|---|---|
| 3,651,315 A | * 3/1972 | Collins | 714/736 |
| 4,369,511 A | 1/1983 | Kimura et al. | 371/21 |
| 4,742,344 A | 5/1988 | Nakagawa et al. | 340/723 |
| 4,752,053 A | 6/1988 | Boetzkes | 246/167 R |
| 4,989,207 A | 1/1991 | Polstra | 371/16.2 |
| 5,051,720 A | 9/1991 | Kittirutsunetorn | 340/310 R |
| 5,144,230 A | 9/1992 | Katoozi et al. | 324/158 R |
| 5,355,493 A | 10/1994 | Silberbauer et al. | 395/700 |
| 5,553,063 A | 9/1996 | Dickson | 370/29 |
| 5,638,004 A | 6/1997 | Combs et al. | 324/539 |
| 5,640,521 A | 6/1997 | Whetsel | 395/311 |
| 5,675,540 A | 10/1997 | Roohparvar | 365/185.22 |
| 5,771,240 A | 6/1998 | Tobin et al. | 371/22.1 |
| 5,799,023 A | 8/1998 | Tanaka et al. | 371/5.1 |
| 5,878,051 A | * 3/1999 | Sharma et al. | 714/724 |
| 5,968,192 A | * 10/1999 | Kornachuk et al. | 714/724 |
| 6,154,855 A | 11/2000 | Norman | 714/10 |
| 6,275,069 B1 | 8/2001 | Chung et al. | 326/98 |
| 6,427,216 B1 | 7/2002 | El-Kik et al. | 714/726 |

FOREIGN PATENT DOCUMENTS

EP     0 738 975 A1     10/1996

OTHER PUBLICATIONS

*IEEE P1149.1/D2991,9 Draft Standard Test Access Port and Boundary–Scan Architecture*; Jan. 19, 2001, pp. 1–227.

*BSM2: Next Generation Boundary–Scan Master*; Frank P. Higgins and Rajagopalan Srinivasan, Bell Laboratories, Lucent Technologies, pp. 1–6.

(Continued)

*Primary Examiner*—Albert Decady
*Assistant Examiner*—Dipakkumar Gandhi
(74) *Attorney, Agent, or Firm*—Weingarten, Schurgin, Gagnebin & Lebovici LLP

(57) ABSTRACT

An embedded electronic system built-in self-test controller architecture that facilitates testing and debugging of electronic circuits and in-system configuration of programmable devices. The system BIST controller architecture includes an embedded system BIST controller, an embedded memory circuit, an embedded IEEE 1149.1 bus, and an external controller connector. The system BIST controller is coupled to the memory circuit and the IEEE 1149.1 bus, and coupleable to an external test controller via the external controller connector. The external test controller can communicate over the IEEE 1149.1 bus to program the memory and/or the system BIST controller circuitry, thereby enabling scan vectors to be debugged by the external test controller and then downloaded into the memory for subsequent application to a unit under test by the system BIST controller.

83 Claims, 7 Drawing Sheets

OTHER PUBLICATIONS

XILINX XC18V00 Series of In–System Programmable Configuration PROMs; DS026 (v3.5) Jun. 14, 2002, www.xilinx.com, Product Specification, pp. 1–20.

*SCANPSC100F Embedded Boundary Scan Controller (IEEE 114.1 Support)*; National Semiconductor, Sep. 1998, DS 100325, www.national.com, pp. 1–25.

*Test–Bus Controller SN74ACT8990*; Texas Instruments, Application Report, SCAA044—Aug. 2000, pp. 1–78.

*Alternative Test Methods Using IEEE 1149.4*, Uros Kac, et al., uros.kac@ijs.si, franc.novak@ijs.si, sreco.macek@ijs.si, marina.santo@ijs.si.

"IEEE P1149.5 Standard Module Test and Maintenance Bus" Pat McHugh, Chairman IEEE P1149. Working Group US Army Research Laboratory–EPSD.

* cited by examiner

METHOD AND APPARATUS FOR EMBEDDED BUILT-IN SELF-TEST (BIST) OF ELECTRONIC CIRCUITS AND SYSTEMS

CROSS REFERENCE TO RELATED APPLICATIONS

This application claims priority of U.S. Provisional Patent Application No. 60/336,586 filed Dec. 4, 2001 entitled METHOD AND APPARATUS FOR EMBEDDED BUILT-IN SELF-TEST (BIST) OF ELECTRONIC CIRCUITS AND SYSTEMS.

STATEMENT REGARDING FEDERALLY SPONSORED RESEARCH OR DEVELOPMENT

N/A

BACKGROUND OF THE INVENTION

The present invention relates generally to Built-In Self-Test (BIST) of Integrated Circuits (ICs), Printed Circuit Boards (PCBs), and systems, and more specifically to an apparatus and method for embedding BIST capability within ICs, PCBs, and systems.

Techniques are known that employ scan testing for providing manufacturing test, debug, and programming of electronic circuits. Such scan testing techniques are often performed according to the IEEE 1149.1 Standard Test Access Port and Boundary Scan Architecture specification ("the IEEE 1149.1 Standard"), which is incorporated herein by reference. The IEEE 1149.1 Standard may also be used to provide In-System Configuration (ISC) of programmable circuits.

The IEEE 1149.1 Standard was initially developed for interconnect testing of PCBs. The IEEE 1149.1 Standard employs a boundary scan path to facilitate access to Input/Output (I/O) pins of devices mounted on a PCB. In addition, the IEEE 1149.1 Standard may be used to access internal scan paths of an IC to facilitate test, debug, ISC, or programming of ICs, PCBs, and systems.

FIG. 1 depicts the conventional IEEE 1149.1 Standard Architecture 100. As shown in FIG. 1, an IC compliant with the IEEE 1149.1 Standard has four (optionally, five) additional component pins TDI, TDO, TCK, and TMS (optionally, TRSTN), which form a Test Access Port (TAP). The IEEE 1149.1 Standard facilitates the connection of TAP ports of multiple electronic circuits to form an IEEE 1149.1 bus, thereby allowing the connected circuits to be accessed using a common TAP protocol. This is typically achieved by connecting the serial data pins TDI and TDO of individual devices in a daisy chain fashion such that the TDO output from a previous device along the chain is connected to the TDI input of a next device in the chain. Then, by connecting all of the TMS and TCK (optionally TRSTN) pins of the devices in common, an overall TAP bus is formed.

FIG. 2 depicts a conventional IEEE 1149.1 bus in a daisy chained configuration 200. As shown in FIG. 2, the TDI pin on a first device U1 202.1 and the TDO pin on a last device Un 202.n are used as the serial data input and serial data output of the IEEE 1149.1 bus, respectively. The bus configuration 200 shown in FIG. 2 is typically employed on a single PCB.

FIG. 3 depicts a conventional IEEE 1149.1 bus in a multi-drop configuration 300. When utilized within a system of PCBs, the multi-drop configuration 300 provides for a single TAP bus across a backplane of the system and allows each PCB to make connections to the same set of wires on the multi-drop bus. Because TCK, TMS, TDI and TRSTN are input signals, these signals can be directly connected across the system backplane to each of the TAPs of the individual PCBs. However, signal clashes may result when connecting the multiple TDO outputs onto the single TDO wire of the multi-drop bus. To avoid such signal clashes, the IEEE 1149.1 Standard requires that the TDO output drive out only when serial data is being shifted into or out of the TAP's TDI and TDO pins. Accordingly, such serial-shift is controlled by internal states of the TAP Controller so that the TDO drive is enabled only during the Shift-IR or the Shift-DR states of the TAP Finite State Machine (FSM). At all other times, the TDO output is disabled by forcing it into an inactive or high-impedance state. Either a specialized version of the TAP controller or an Addressable TAP Linking (ATL) circuit may be employed to implement the multi-drop bus configuration 300 of FIG. 3. Such an ATL circuit is described in co-pending U.S. Patent Application No. 60/303,052 filed Jul. 5, 2001 entitled METHOD AND APPARATUS FOR OPTIMIZED PARALLEL TESTING AND ACCESS OF ELECTRONIC CIRCUITS.

An external test controller can be connected to the TDI, TDO, TMS, TCK, and TRSTN lines of the respective IEEE 1149.1 bus in the daisy chained or multi-drop configurations 200 and 300. The external test controller can then communicate with the respective Units Under Test (UUTs) 202.1–202.n or 302.1–302.n using the IEEE 1149.1 bus protocol. These bus configurations 200 and 300 are commonly used in production manufacturing of electronic systems, in which the external test controller is typcially some form of Automatic Test Equipment (ATE) such as an In-Circuit Tester (ICT) or a Personal Computer (PC) based boundary scan tool.

There is a need for embedding Built-In Self-Test (BIST) capability within a system to be tested, on one or more PCBs of the system to be tested, and/or on one or more ICs of the system to be tested. Such embedded BIST capability would allow circuitry resident within the system to apply scan vector sequences that would otherwise be applied by an external test controller. Further, such embedded BIST capability would enable tests to be readily performed either remotely or in the field. For example, such testing may be performed automatically at system power-up or by invoking the embedded BIST circuitry at some other time.

FIG. 4 depicts a conventional configuration 400 for providing embedded BIST capability in electronic systems. The BIST configuration 400 comprises an architecture designed around a general-purpose microprocessor 402 and a data conversion circuit 404 that converts between the parallel data/protocol of the microprocessor 402 and the serial scan protocol (e.g., the IEEE 1149.1 protocol) of the UUT. As shown in FIG. 4, both Read-Only Memory (ROM) 406 and Random Access Memory (RAM) 408 are connected to a bus 410 of the microprocessor 402. The ROM 406 stores program code and the RAM 408 stores data used when the microprocessor 402 executes the stored programs.

The embedded BIST configuration 400 further includes interface logic 412 connected between the microprocessor 402 and the parallel/serial protocol converter circuit 404 to match the address and control signals of the microprocessor 402 to those of the converter circuit 404. The parallel protocol/data of the microprocessor 402 are converted to the inputs and outputs forming the IEEE 1149.1 bus 414 by the parallel/serial converter 404. The IEEE 1149.1 bus 414 may then be employed to drive a respective IEEE 1149.1 bus on a PCB or within an IEEE 1149.1 bus configuration such as the daisy chained configuration 200 (see FIG. 2) or the multi-drop configuration 300 (see FIG. 3). Moreover, the embedded BIST configuration 400 includes an external connector 416 that bypasses the parallel/serial protocol converter circuit 404 and enables an external test controller 407 to be connected in place of the data conversion circuit 404. When the external test controller 407 is connected in this manner, an OE signal operates to disable the parallel/serial protocol converter circuit 404 from controlling the IEEE 1149.1 bus 414, thereby allowing the external test controller 407 to control the IEEE 1149.1 bus 414.

As described above, the conventional embedded BIST configuration 400 includes the microprocessor 402, non-volatile storage in the form of the ROM 406, and read/write storage in the form of the RAM 408. For such a microprocessor-based approach, a user (i.e., a human operator) normally writes program code (e.g., C code) and compiles and links the code with a library of scan test functions. The linked code resides in the ROM 406 (which also includes the scan vector data) and is executed by the microprocessor 402 to apply and evaluate the scan vectors. The RAM 408 is employed for temporary storage during various microprocessor operations such as comparing actual scan-out data with expected scan-out data.

As a result, the conventional configuration 400 for providing embedded BIST capability requires customization of the embedded test solution for each application. Specifically, the program code is developed and debugged for each specific system. In addition, the scan vectors that are normally applied by the external test controller are converted to operate with the embedded test software, which often comprises a different test application environment than that used by the external test controller (i.e., different processor architecture, different operating system, and different software drivers). This requires extra work in addition to test development and debug with the external test controller and therefore adds to the total system cost and complexity.

Moreover, in the conventional embedded BIST configuration 400, the microprocessor 402 is often shared or re-used as the test processor. This approach is intended to save costs by not requiring a separate dedicated processor for use as the embedded test controller. However, the microprocessor 402 and any other support circuitry the microprocessor 402 requires typically cannot be placed in the scan chain(s) of the system during embedded testing because this circuitry is employed to apply and analyze the embedded tests. Accordingly, the fault coverage of the system during embedded testing is reduced because the entire microprocessor infrastructure of the system is not part of the embedded test. Further, a significant portion of the system (e.g., the microprocessor 402 and all its support circuitry) must be free from defects in order to test the remainder of the system. So, although this approach may reduce circuit costs for embedded BIST implementation, test costs may increase. For example, the microprocessor infrastructure of the system may require a separate test methodology and development effort, and may be unable to take advantage of the structured scan methodologies of the remainder of the system.

The need for embedded BIST capabilities in PCBs and systems has grown considerably as the designs of ICs, PCBs, and systems have become more complex. Advances in electronic designs have enabled new product capabilities in the areas of, e.g., telecommunications and information technologies. Such advances have resulted in a growing need for high quality built-in testing and ISC of programmable logic (e.g., CPLDs and FPGAs). Further, increased market demand for such products and increased competition in the market place continue to place pressure on manufacturers of electronic systems to reduce costs and improve time to market. Accordingly, new techniques that both reduce costs and minimize the time required for embedded BIST and ISC of PCBs and systems are needed.

BRIEF SUMMARY OF THE INVENTION

In accordance with the present invention, an embedded electronic system Built-In Self-Test (BIST) controller architecture is provided that facilitates testing and debugging of electronic circuits and In-System Configuration (ISC) of programmable devices. The presently disclosed system BIST controller architecture reduces costs associated with circuit implementation and scan vector development and debug for system BIST applications. The cost of implementation is reduced because the need for a microprocessor-based system BIST solution is eliminated. In addition, debug time is reduced because the data format of a system BIST controller can be made to correspond to that of an external test controller. As a result, applications debugged with the external test controller can operate successfully in the embedded system BIST controller environment.

Moreover, with the presently disclosed system BIST controller architecture, the engineering time required for custom software development and debug is reduced or eliminated. This includes the time required to run scan vector conversion tools, develop program code using scan function libraries, develop code for the specific microprocessor architecture used, and perform debug in the embedded processor environment.

Further, the system BIST controller architecture comprises a "code-less" solution to system BIST because it does not include a general-purpose microprocessor. Accordingly, the system BIST controller architecture requires less circuitry to implement, thereby reducing both the cost and circuit area needed for the system BIST solution.

The code-less architecture of the system BIST controller has data programmed into a FLASH memory including data for application and analysis of the scan vectors used for embedded system test and ISC. Accordingly, the system BIST controller architecture may be configured to operate using a Scan Object Format (SOF) compatible with the external test controller.

In one embodiment, the system BIST controller architecture includes the embedded system BIST controller, the embedded FLASH memory circuit, an embedded IEEE 1149.1 bus, and an external controller connector. The system BIST controller is coupled to the FLASH memory circuit and the IEEE 1149.1 bus, and coupleable to the external test controller via the external controller connector. The external test controller can communicate over the IEEE 1149.1 bus (i.e., in a "pass through" mode) to program the FLASH memory and/or the system BIST controller circuitry. In this way, the system BIST controller architecture enables scan vectors to be debugged by the external test controller and then downloaded into the FLASH memory.

Once the scan vectors are programmed into the FLASH memory, the external test controller can be removed or disabled, and the scan vectors can be applied to a circuit or Unit Under Test (UUT) by the system BIST controller in the embedded test environment. This eliminates the need to develop and debug scan vectors for two different environments. As a result, users can easily develop, verify, and debug scan tests using the external test controller before programming them into the FLASH memory.

Because the system BIST controller is configured to apply and analyze scan vectors without requiring a general purpose microprocessor, the system BIST controller can perform on-the-fly comparisons of scan data in hardware. Accordingly, both the data format of the scan vectors and the circuitry of the system BIST controller provide for comparing actual scan-out values, i.e., as output by the circuit or UUT, to expected scan-out values.

The presently disclosed system BIST controller architecture provides for full coverage of the entire functional system. Further, the complete infrastructure of the system processor can be included in the scan chain(s) for embedded test and can therefore be fully tested by the system BIST controller. Moreover, the system BIST controller architecture enables BIST to be embedded within a system to be tested, on one or more PCBs of the system to be tested, and/or on one or more ICs of the system to be tested, while reducing circuit overhead. In addition, the engineering effort for development and debug of scan vectors is reduced because the system BIST controller architecture provides for a seamless transition from the application of scan vectors using the external test controller to the embedded test application. The system BIST controller architecture does not require a complex microprocessor infrastructure, thereby enabling it to operate independent of the functional processor of the system. Further, the system BIST controller architecture can be implemented either within an existing IC in the system or as a separate dedicated test circuit. As a result, the system BIST controller architecture reduces costs and improves time-to-market.

Other features, functions, and aspects of the invention will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which.

DETAILED DESCRIPTION OF THE INVENTION

U.S. Provisional Patent Application No. 60/336,586 filed Dec. 4, 2001 is incorporated herein by reference.

Figure 5:
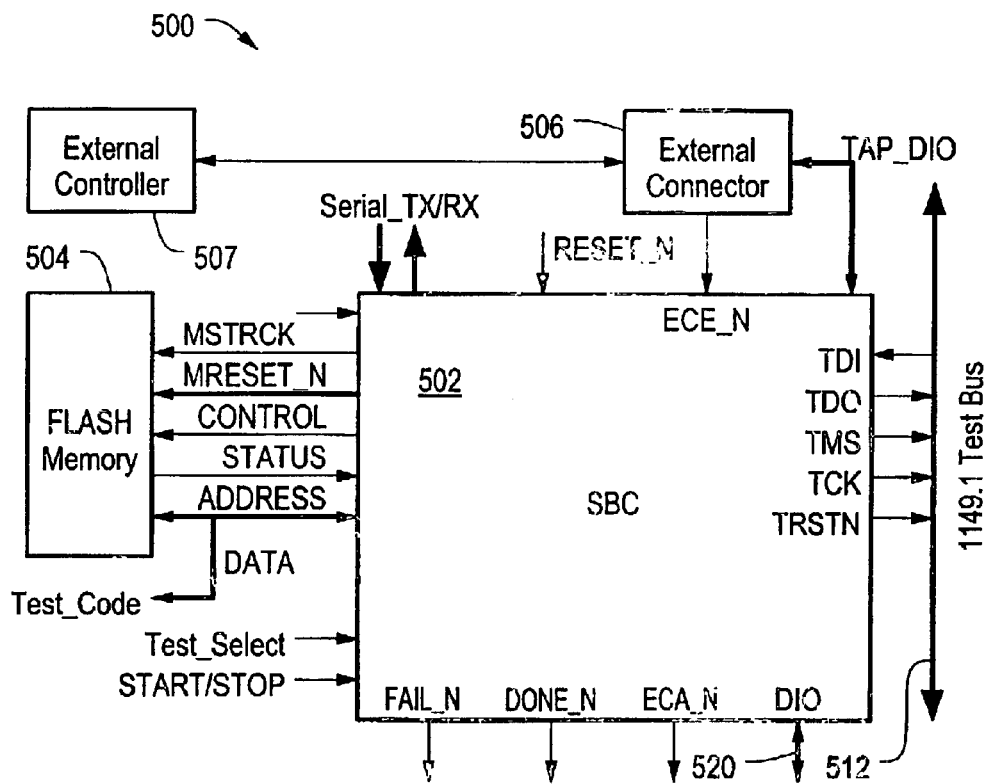
FIG. 5 is a block diagram of an electronic system built-in self-test controller architecture according to the present invention.

FIG. 5 depicts an illustrative embodiment of an electronic system Built-In Self-Test (BIST) controller architecture 500, in accordance with the present invention. In the illustrated embodiment, the system BIST controller architecture 500 includes an embedded IEEE 1149.1 bus 512, an embedded system BIST controller 502 coupled to the IEEE 1149.1 bus 512 and a Digital I/O (DIO) bus 520, an embedded memory 504 coupled to the system BIST controller 502, and an external connector 506 coupled to the system BIST controller 502. The external connector 506 is coupleable to an external test controller 507. In a preferred embodiment, the memory 504 comprises one or more FLASH memory devices such a FLASH EPROM or a FLASH EEPROM. It is understood, however, that the memory 504 may alternatively comprise any suitable type of non-volatile storage including a magnetic disk. Further, the external test controller 507 may comprise any suitable type of Automatic Test Equipment (ATE) such as an In-Circuit Tester (ICT) or a Personal Computer (PC) based boundary scan tool.

Figure 6:
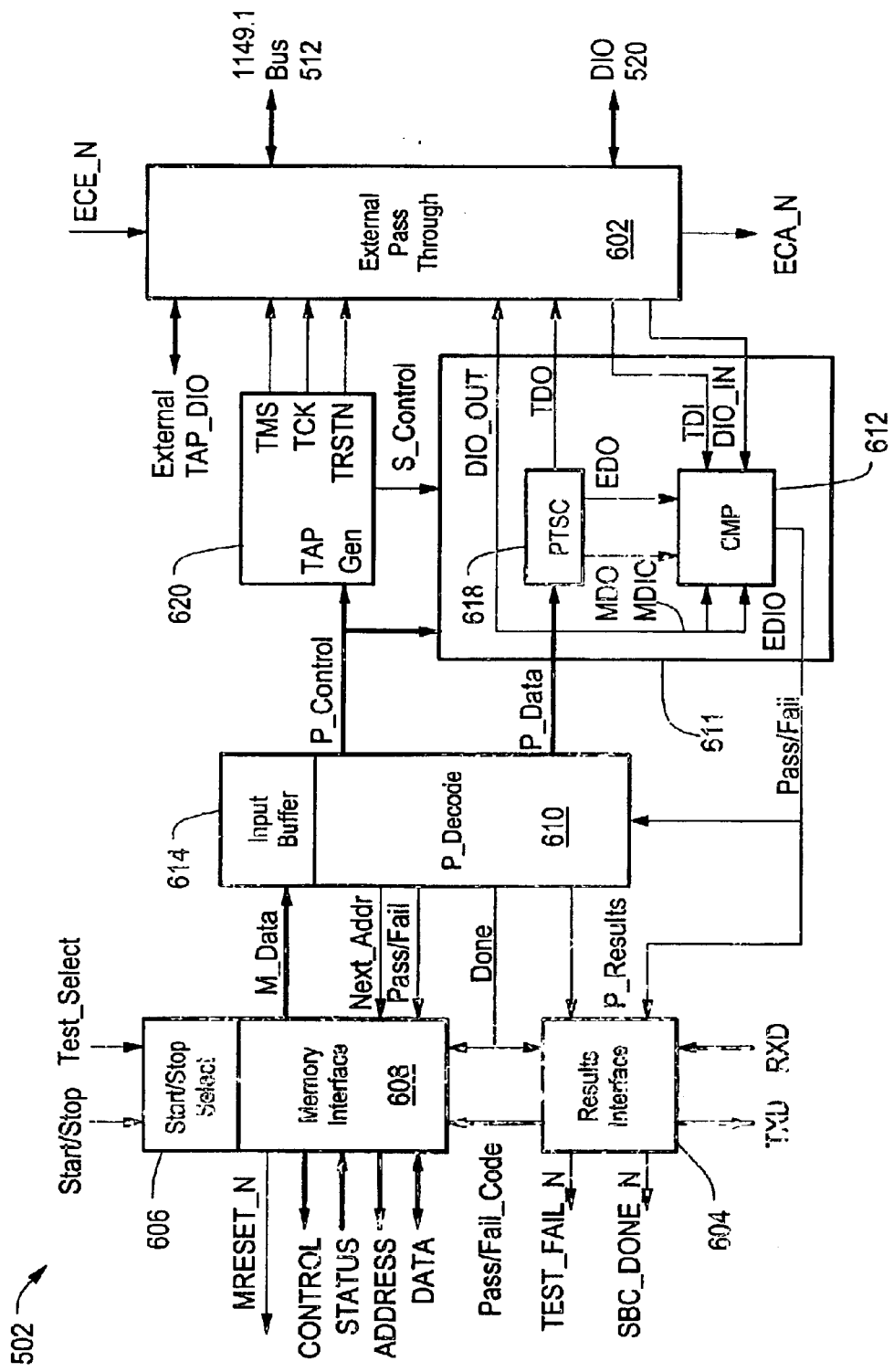
FIG. 6 is a block diagram of an electronic system built-in self-test controller included in the architecture of FIG. 5.

FIG. 6 depicts an illustrative embodiment of the system BIST controller 502 included in the system BIST controller architecture 500 (see FIG. 5). In the illustrated embodiment, the system BIST controller 502 includes an external-pass-through circuit 602, a results interface 604, a start/stop select circuit 606, a memory interface 608, a Parallel Decode circuit (P_Decode) 610, a data conversion and compare unit 611 including a Compare (CMP) circuit 612 and a Parallel-To-Serial Conversion (PTSC) circuit 618, an input buffer 614, and a Test Access Port (TAP) generator circuit 620. The structure and operation of the presently disclosed system BIST controller architecture 500 are described below with reference to FIGS. 5–6.

Reset and Synchronization

FIG. 5 depicts two (2) input signals to the system BIST controller 502 that are omitted from FIG. 6 for clarity of illustration. One input signal is RESET_N, which is used to reset the system BIST controller 502. For example, the RESET_N input may be provided by the external test controller 507. In the illustrated embodiment, when the RESET_N signal is asserted logical low, registers and state machines of the system BIST controller 502 are reset to appropriate initial states so that the controller 502 is ready to start applying scan vectors stored in the FLASH memory 504. The other input signal is MSTRCK, which is a master clock signal used to synchronize all activity in the system BIST controller 502. For example, the MSTRCK signal may be provided by an external clock source (not shown) and used to derive the frequency of the TCK signal on the IEEE 1149.1 bus 512.

External Controller Interface

The external-pass-through circuit 602 (see FIG. 6) is configured to enable the selection of either the external test controller 507 or the system BIST controller 502 for subsequent connection to the IEEE 1149.1 bus 512 and the DIO bus 520. Such selection is made using an External Controller Enable (ECE_N) input provided by the external connector 506 to the external-pass-through circuit 602. In the illustrated embodiment, when the ECE_N signal is asserted logical low, the system BIST controller 502 is reset and the IEEE 1149.1 bus 512 and the DIO bus 520 are controlled with external TAP_DIO signals provided by the external test controller 507 via the external connector 506. In the presently disclosed embodiment, connecting the external test controller 507 to the external connector 506 automatically asserts the ECE_N signal logical low and switches control of the IEEE 1149.1 bus 512 and the DIO bus 520 from the system BIST controller 502 to the external test controller 507. As a result, an External Controller Active (ECA_N) output signal provided by the external-passthrough circuit 602 goes logical low to indicate that the external test controller is switched to control the IEEE 1149.1 bus 512 and the DIO bus 520. When the ECE_N signal is logical high, the system BIST controller 502 controls the IEEE 1149.1 bus 512 and the DIO bus 520.

Controlling the IEEE 1149.1 and DIO buses 512 and 520 by the external test controller 507 provides support for test development and debug from the external test controller 507, which in the presently disclosed embodiment includes circuitry compatible with the rest of the system BIST controller architecture 500. For example, the FLASH memory 504 may be programmed by the external test controller 507. In an alternative embodiment, the FLASH memory 504 may be programmed by an external general purpose microprocessor (not shown). In this case, the external microprocessor controls the DATA bus, the ADDRESS bus, and the CONTROL/STATUS bus of the memory interface 608 included in the system BIST controller 502. By monitoring SBC_DONE_N and TEST_FAIL_N output signals provided by the results interface 604 and the ECA_N signal provided by the external-pas-through circuit 602, the external microprocessor can determine whether the DATA bus is free.

Test Start/Stop and Select

The start/stop select circuit 606 (see FIG. 6) is used to select a scan vector suite to be run by the system BIST controller 502 and start/stop application of the scan vectors. The start/stop select circuit 606 interfaces to the memory interface 608 and has the following inputs:

START/STOP: This input causes a START or STOP sequence to occur in the system BIST controller 502. For example, the system's power-on reset circuitry may provide the START/STOP input to the start/stop select circuit 606.

Test_Select: When the START sequence occurs, values on the Test_Select inputs determine what tests are to be run by the system BIST controller 502. For example, an external switch or jumper may provide the Test_Select input to the start/stop select circuit 606.

In the illustrated embodiment, a rising edge on the START/STOP signal initiates the START sequence in the system BIST controller 502, during which time the values on the Test_Select inputs are registered and the memory interface 608 is signaled to begin accessing the FLASH memory 504 (see FIG. 5). The Test_Select values map to a location of the FLASH memory 504 where a predetermined Start Address of the scan vector suite is stored. Once the START sequence is initiated and the system BIST controller 502 begins applying the scan vectors, the START/STOP input to the start/stop select circuit 606 remains logical high to allow the controller 502 to continue applying the selected scan vector sequence. While the system BIST controller 502 is busy applying scan vectors, a falling edge on the START/STOP input causes the system BIST controller 502 to halt and subsequently execute a predetermined clean-up sequence. When the START/STOP input is held logical low, the system BIST controller 502 remains in an idle state. In the presently disclosed embodiment, the START/STOP signal is initially pulled-down so that on power-up the system BIST controller 502 remains in its idle state waiting for the first START event.

Memory Interface and Organization

The memory interface 608 (see FIG. 6) includes circuitry for communicating with the FLASH memory 504 (see FIG. 5). In the presently disclosed embodiment, the FLASH memory 504 is a word-based FLASH memory. However, it should be understood that the system BIST controller 502 may be configured to interface to other memory types and configurations. The memory interface 608 includes inputs and outputs for controlling the FLASH memory 504 as follows:

MRESET_N: This is an output from the memory interface 608 which when active low, resets the FLASH memory device 504.

CONTROL: This is a set of signals used in controlling erase, program, and read operations of the FLASH memory 504. These signals include Chip Enable (CE), Output Enable (OE), and Write Enable (WE) signals. It is understood that controls vary depending upon the particular FLASH device, manufacturer, and the number of devices used to implement the FLASH memory.

STATUS: This is an input to the memory interface 608 for monitoring the Ready/Busy status of the FLASH memory device 504.

ADDRESS: These are outputs from the memory interface 608, which provide the address of a location of the FLASH memory 504 to be read or programmed.

DATA: This is data read from or programmed to the FLASH memory 504.

Configuration Table

Figure 8:
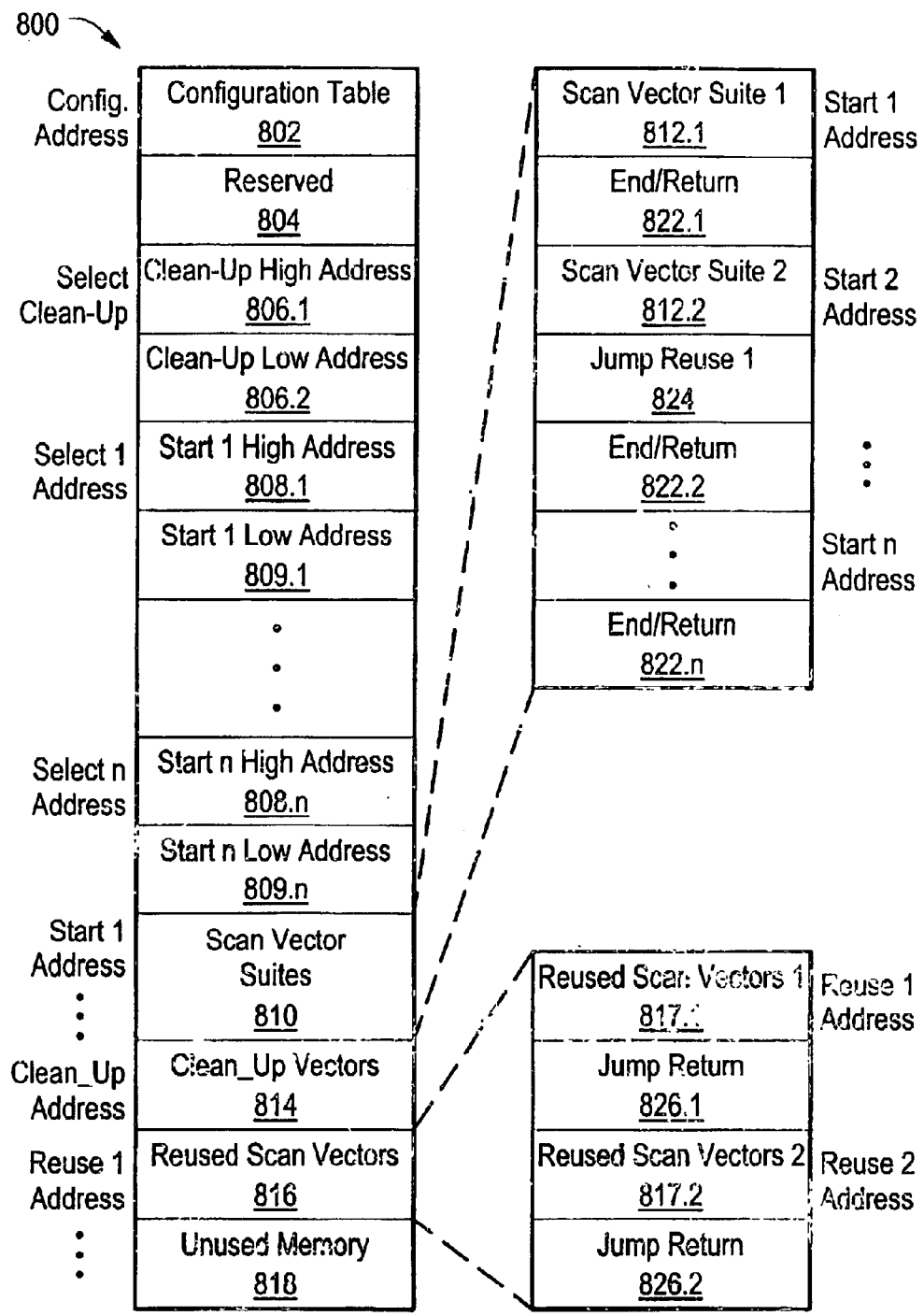
FIG. 8 is a diagram illustrating the organization of a FLASH memory included in the architecture of FIG. 5.

When the system BIST controller 502 (see FIGS. 5–6) receives the START signal, the controller 502 causes the memory interface 608 to read a configuration table out of the FLASH memory 504, thereby providing initial configuration and set-up information for the system BIST controller 502. In the presently disclosed embodiment, the configuration table is stored starting at a fixed location assigned to address 0 of the FLASH memory 504. FIG. 8 depicts an exemplary organization 800 of the FLASH memory 504 (see FIG. 5) showing the configuration table 802 stored at the fixed location Config Address.

The configuration table includes the following configuration and timing information:

Memory Density: This is an encoded value that indicates the storage size (or depth) of the FLASH memory device 504.

Memory Delay: This is the address-to-output delay time of the FLASH memory device 504, which can be represented as a number of delay cycles.

The Memory Density is used by the memory interface 608 for automatically controlling the CE selection. This enables the system BIST controller 502 to support memory configurations implemented with multiple memory banks/devices. In the presently disclosed embodiment, the Memory Density is a predetermined binary code. For example, an 8-bit binary code of 00001010 may indicate that a 256 Mb FLASH memory device is a being used, from which the system BIST controller 502 can determine which CE to assert for any selected memory address.

The Memory Delay is used by the memory interface 608 to control the timing of read operations from the FLASH memory 504. Specifically, the Memory Delay is used in generating a time delay, after which read data will be valid and can be accessed from the FLASH memory 504. The Memory Delay is calculated from the FLASH memory's specification for address-to-output delay (e.g., in nanoseconds) and the frequency of the MSTRCK signal (e.g., in MHz). A default Memory Delay is used on power-up reset for initially reading the configuration table from the FLASH memory 504 so that the lowest performance memory device supported by the system BIST controller 502 has sufficient access time to reliably return read data.

Alternative embodiments of the system BIST controller 502 may provide for other configuration and set-up information. The information in the configuration table is specified by a user (e.g., a human operator or a computerized process) and may be programmed into the FLASH memory 504 by the external test controller 507.

Selecting a Start Address

After reading the configuration table, the memory interface 608 of the system BIST controller 502 goes to the Start Address location in the FLASH memory 504 determined by the registered Test$_{13}$ Select inputs, and starts applying the selected scan vector suite. There are n+1 address locations allocated in the FLASH memory 504 that are mapped to the Test_Select inputs. FIG. 8 depicts these address locations as a Select Clean-Up Address and Select 1-$n$ Addresses. In the illustrated embodiment, two (2) words comprising high and low segments 806.1 and 806.2 of the Clean-Up address are stored in the FLASH memory 504. Similarly, two (2) words comprising high and low segments 808.1–808.$n$ and 809.1–809.$n$ of the Select 1–n Addresses are stored for each of 16 Select Addresses (e.g., n=15). The Start 1–n Addresses are programmed into the FLASH memory 504 along with the configuration table and scan vector data.

Once the Start Address is determined, the memory interface 608 begins reading data from the FLASH memory 504 starting at that Start Address and continuing until the end of the scan vectors for this scan vector suite are reached. In the event a failure is detected during the test or there is a falling edge on the START/STOP signal, the memory interface 608 initiates a predetermined clean-up sequence, which is described below.

Scan Object Organization

Following the Start 1–n Address areas 808.1–808.$n$ and 809.1–809.$n$ of the FLASH memory 504 is a storage area for a plurality of Scan Vector Suites 810. FIG. 8 depicts an exemplary arrangement of the Scan Vector Suites 810 in the FLASH memory 504 (see FIG. 5). Each of the Scan Vector Suites 810 can include any number of tests or ISC data, and each is addressed by a respective Start 1-$n$ Address. For example, the Start 1 Address may comprise the memory location for the start of a first Scan Vector Suite 810. In the presently disclosed embodiment, these scan vectors are applied by the system BIST controller 502 when the Test_ Select inputs to the controller 502 are set to a value of 1 and a START signal is applied to the controller 502.

FIG. 8 depicts Clean-Up Vectors 814 following the Scan Vector Suites 810 in the FLASH memory 504. The Clean-Up Vectors 814 are stored starting at a Clean-Up Address, which is selected as the Start Address in the event the START/STOP input transitions to logical low or a failure is detected during the test. Either of these two events causes the system BIST controller 502 to stop applying the scan vectors, run the Clean-Up Vectors, and then remain idle. In an alternative embodiment, the Clean-Up Address may be selected when the Test_Select inputs are logical 0, which in this alternative embodiment may translate to the Select Clean-Up address.

FIG. 8 further depicts an expanded view of the Scan Vector Suites 810 storage area in the FLASH memory 504 showing data stored at Start 1–n Addresses. In the illustrated embodiment, the stored data includes Scan Vector Suites 812.1–812.$n$ followed by respective End/Return commands 822.1–822.$n$. In the presently disclosed embodiment, the Clean-Up Vectors 814 employ the same scan object format as the Scan Vector Suites 810, including the End/Return command to terminate the vectors.

The system BIST controller 502 provides for re-using a selected set of scan vectors when that set is used in more than one scan vector suite. For example, while formatting scan vectors for subsequent programming into the FLASH memory 504, software in the external test controller may automatically detect and identify any scan vectors that are duplicated in the Scan Vector Suites 810 or the Clean-Up Vectors 814. In the illustrated embodiment, these duplicated scan vectors are called Reused Scan Vectors 816 and are stored in the FLASH memory 504 immediately after the Clean-Up Vectors 814. FIG. 8 depicts the Reused Scan Vectors 816 stored in the FLASH memory 504 starting at Reuse 1 Address.

In the presently disclosed embodiment, the Reused Scan Vectors 816 are stored only once in the FLASH memory 504. Further, a Jump Address command is inserted in place of the reused scan vectors at each instance where these vectors occur in the scan vector suites. For example, the expanded view of the Scan Vector Suites 810 shows a Jump Reuse 1 824 command following the Scan Vector Suite 2 812.2. When the system BIST controller 502 executes the Scan Vector Suite 2 812.2, the Jump Reuse 1 824 command causes the controller 502 to jump to location Reuse 1 Address of the FLASH memory 504, as depicted in an expanded view of the Reused Scan Vectors 816 (see FIG. 8), thereby allowing Reused Scan Vectors 1 817.1 to be executed by the controller 502. It is noted that Reused Scan Vectors 1 817.1 followed by a Jump Return command 826.1 are stored in the FLASH memory 504 starting at location Reuse 1 Address, and the Reused Scan Vectors 2 followed by a Jump Return command 826.2 are stored in the FLASH memory 504 starting at the location Reuse 2 Address. After the system BIST controller 502 executes the Reused Scan Vectors 1 817.1, the Jump Return 826.1 command causes the controller 502 to return to the memory location where the End/Return 822.2 command is stored, thereby terminating the execution of the scan vectors.

By re-using the Reused Scan Vectors 1–2 817.1–817.2, there is a reduction in the memory storage requirements of the system BIST controller architecture 500 (see FIG. 5). The storage savings corresponds to the size and number of duplicate instances of each re-usable scan object. This can result in maximum utilization of memory storage for the scan vectors.

The Jump Reuse 1 824 command, the End/Return 822.1–822.$n$ commands, and the Jump Return 826.1–826.2 commands provide flow control to the memory interface 608 when applying the Scan Vector Suites 810. For example, these flow control commands may occupy multiple words in the FLASH memory 504, depending on the command type and function. It is noted that whenever a Jump Reuse command is specified, a corresponding Jump Return address is also specified. For example, when the system BIST controller 502 encounters the Jump Reuse 1 824 command when executing the Scan Vector Suite 2 812.2, the controller 502 jumps to the memory location Reuse 1 Address. Next, when the system BIST controller 502 encounters the Jump Return 826.1 command after executing the Reused Scan Vectors 1 817.1 starting at the memory location Reuse 1 Address, the controller 502 uses the Jump Return address as given in the jump command to return from the jump. The End/Return 822.2 command causes the system BIST controller 502 to stop applying scan vectors and remain in an idle state until another START signal is received. The P_Decode circuit 610 signals the memory interface 608 that an End/Return command was decoded, thereby causing the memory interface 608 to stop fetching data from the FLASH memory 504. It is noted that the memory interface 608 also stops fetching data in the event of a test failure, as indicated on a Pass/Fail line by the CMP circuit 612.

Conditional Jump

In alternative embodiments of the system BIST controller architecture 500, additional flow control may be provided by conditional jump commands. For example, one such conditional jump command is called an If-Jump Address command. Whereas the above-described Jump Reuse command directs the system BIST controller 502 to go to a predetermined memory address, the If-Jump Address command directs the controller 502 to go to a predetermined memory address when a compare condition is "true". If the compare condition is "false", then the If-Jump Address command goes to the address of the next command in the FLASH memory 504. As with the unconditional Jump Address command, when the If-Jump command is executed, the If-Jump command uses the Jump Return command to return to the supplied Jump Return Address.

In this alternative embodiment, the If-Jump command comprises a compare of scan data returned from one or more the Units Under Test (UUTs) in the system. Expected scan data is included with the If-Jump command and is compared to actual scan data returned from the UUTs. If the expected and actual data "compare" (i.e., the compare condition is true), then the If-Jump command transfers the flow of data coming from the memory interface 608 to the specified target address. For example, conditional jumps may be used to select scan vectors based on UUT type or a particular system configuration.

Figure 1:
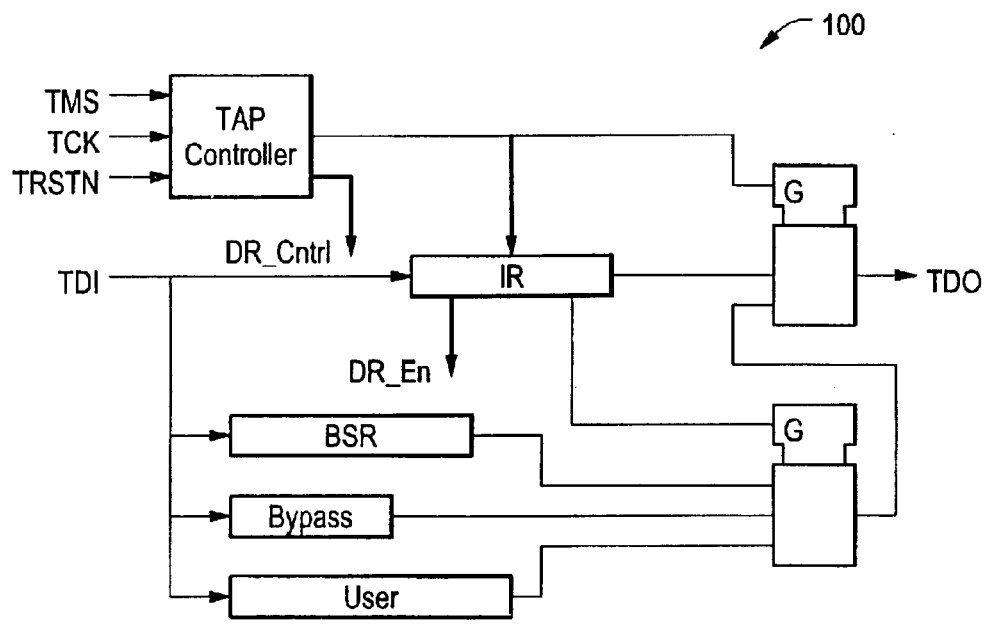
FIG. 1 is a block diagram of the conventional IEEE 1149.1 test access port and boundary scan architecture.
Figure 2:
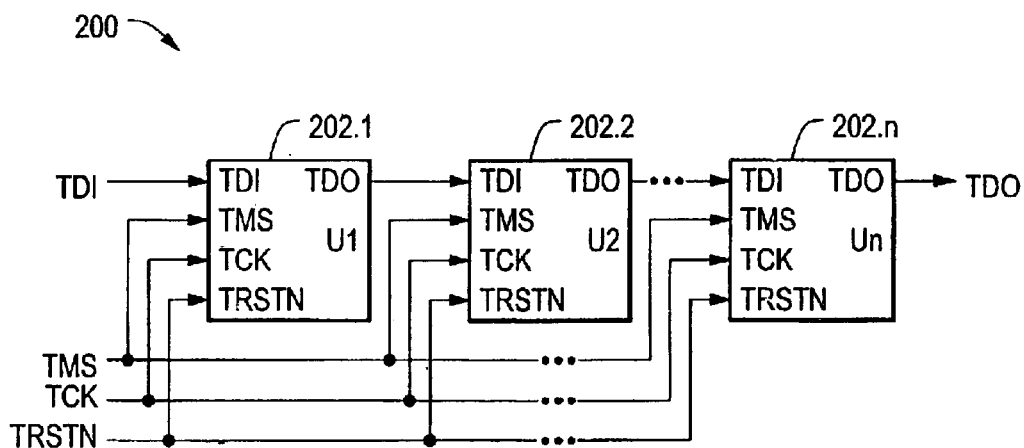
FIG. 2 is a block diagram of the conventional IEEE 1149.1 standard bus in a daisy chained configuration.
Figure 3:
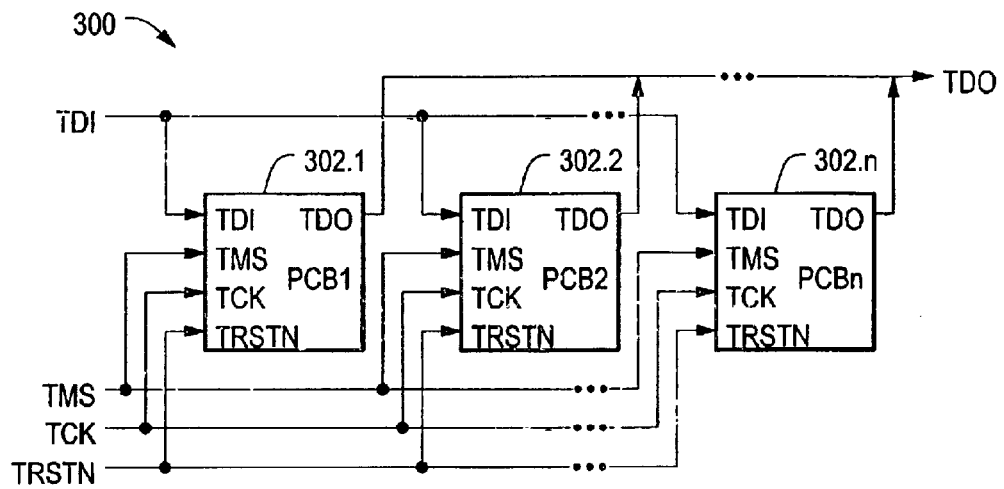
FIG. 3 is a block diagram of the conventional IEEE 1149.1 standard bus in a multi-drop configuration.
Figure 4:
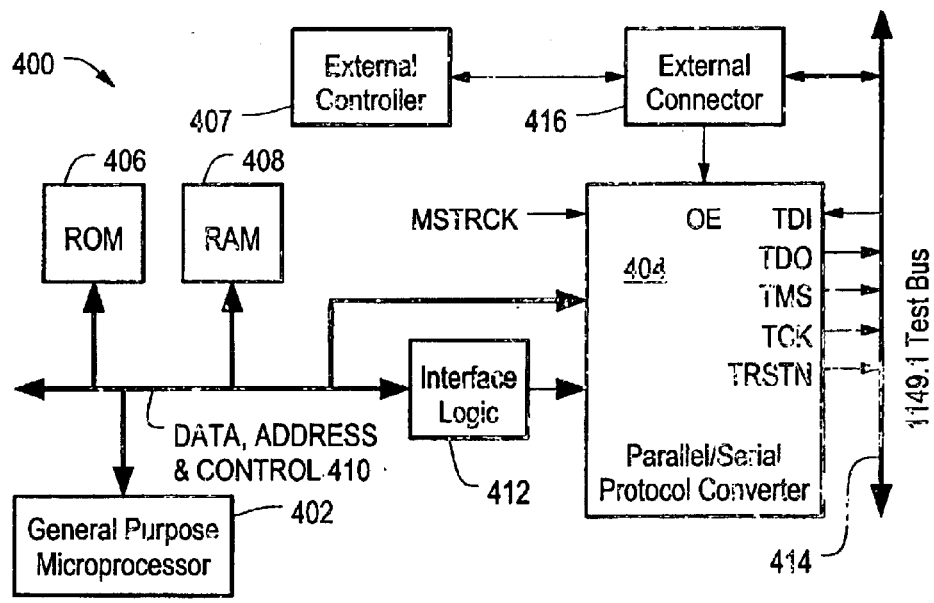
FIG. 4 is a block diagram of a conventional configuration for providing embedded built-in self-test capability in an electronic device or system.

It is noted that the above-mentioned UUTs are coupleable to the IEEE 1149.1 bus 512 and/or the DIO bus 520 (see FIG. 5). For example, the UUTs may be coupled to the IEEE 1149.1 bus 512 in either the daisy chained or multi-drop configurations 200 and 300 (see FIGS. 2–3). Further, the UUTs may be coupled to the DIO bus 520 in any known manner so as to avoid bus contention.

Scan Object Format

Figure 7:
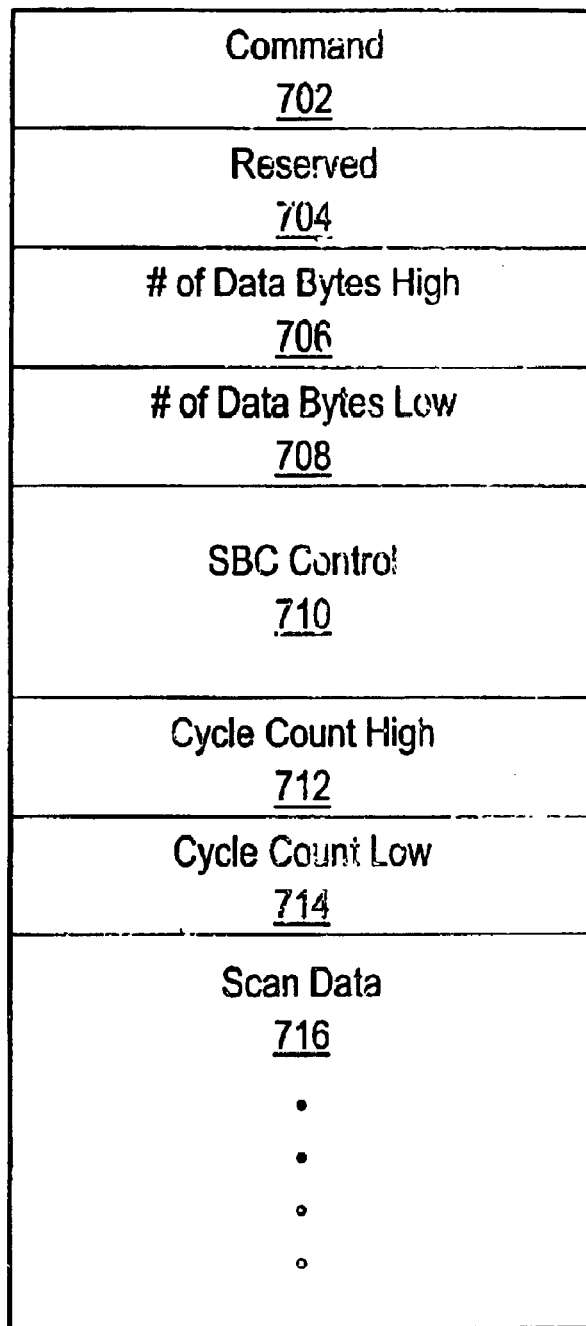
FIG. 7 is a diagram illustrating the format of a scan object employed by the controller of FIG. 6.

FIG. 7 depicts an illustrative representation of a portion of a scan object 700, as stored in the FLASH memory 504. It is noted that such scan objects may be stored in the FLASH memory 504 in a binary format. In the presently disclosed embodiment, each of the Scan Vector Suites 810 and the Clean-Up Vectors 814 (see FIG. 8) is formatted as a single scan object. Further, each scan object comprises a plurality of formatted segments such as a Command segment 702, a Reserved segment 704, a Number of Data Bytes High segment 706, a Number of Data Bytes Low segment 708, a System BIST Controller (SBC) Control segment 710, a Cycle Count High segment 712, a Cycle Count Low 714 segment, and a Scan Data segment 716. Data words included in each of these segments are defined as follows.

Command: This segment 702 indicates an SBC operation. Examples of SBC commands include the Scan Vectors command, the End/Return command, the Jump Address command, the If-Jump Address command, the Jump Return command, the Error Code command, and the Message Text command.

Reserved: This segment 704 indicates a word reserved for future use.

Of Data Bytes High/Low: These segments 706 and 708 comprise two (2) words indicating the size (e.g., the number of data bytes) of the corresponding scan object segment.

SBC Control: This segment 710 provides hardware control settings for selected portions of the system BIST controller 502 (see FIGS. 5–6). The control settings are determined and set by user input or automatically by the software of the external test controller 507 (see FIG. 5).

Cycle Count High/Low: Each of these segments 712 and 714 indicates the number of scan clocks to be applied for the command.

Scan Data: For a Scan Vector command, the words of this segment 716 include the actual scan data used for applying and analyzing the scan vectors.

Input Buffer and Parallel Decode

As the memory interface 608 reads data words from the FLASH memory 504, the memory interface 608 outputs the data words over an M_Data bus to the input buffer circuit 614 (see FIG. 6). The input buffer circuit 614 receives the data words over the M_Data bus, stores the data words, and buffers a number of the data words for processing by the P_Decode circuit 610.

In the illustrated embodiment, the P_Decode circuit 610 decodes the data words out of the input buffer circuit 614, generates appropriate controls for other portions of the system BIST controller 502 based on the decoded commands, and sends parallel scan data to the PTSC circuit 618. In the illustrated embodiment, the P_Decode circuit 610 has the following inputs and outputs:

P_Control: Based on the decoded commands in the scan objects, the P_Decode circuit 610 sends control signals to other portions of the system BIST controller 502 over this output bus.

P_Data: This output bus comprises scan data in parallel word format decoded from scan objects.

Pass/Fail: This input is provided by the CMP circuit 612.

Next_Addr: This output bus is used to signal a next address to the memory interface 608 for Jump commands.

Done: This output is asserted by the P_Decode circuit 610 when the circuit 610 finishes applying a set of scan vectors, e.g., when one of the Scan Vector Suites 810 or the Clean-Up Vectors 814 has completed. The system BIST controller 502 goes to the idle state when the Done signal is asserted. This output is applied by the P_Decode circuit 610 to the memory interface 608 and the results interface 604.

P_Results: This output bus provides decoded results information to the results interface 604. For example, the P_Results bus may provide extended information (i.e., codes and/or messaging) related to the application of the scan vectors to the results interface 604. The P_Results information is valid after the P_Decode circuit 610 has asserted the Done signal.

In the presently disclosed embodiment, the P_Decode circuit 610 completes the current scan operation when the CMP circuit 612 signals via the Pass/Fail line that a failure has occurred. This assures that the application of the scan data is not interrupted in mid-operation, which may leave partial scan data updated in the system. For example, such partial scan data left in the scan paths of the system that may cause bus contention or some undesirable circuit state that may damage the system or test circuitry before the Clean-Up Vectors are applied.

TAP Generator

The TAP generator circuit 620 receives input from the P_Decode circuit 610 over the P_Control bus, and generates the IEEE 1149.1 TAP protocol corresponding to the decoded scan objects. The TAP generator 620 generates the TMS, TCK, and TRSTN outputs of the system BIST controller 502 (see FIG. 5). When the ECE_N signal is logical high, the system BIST controller 502 sources these signals on the IEEE 1149.1 bus 512. The TAP generator 620 also outputs a control signal S_Control to the data conversion and compare unit 611.

Parallel Conversion and Compare

The data conversion and compare unit 611 (see FIG. 6) includes the CMP and PTSC circuits 612 and 618, which receive input scan data in parallel form from the P_Decode circuit 610 over the P_Data bus. The CMP and PTSC circuits 612 and 618 also receive the P_Control signals from the P_Decode circuit 610 and the S_Control signals from the TAP generator 620.

In the presently disclosed embodiment, the PTSC circuit 618 takes test vector data in parallel form, and converts the test vector data into serial form (i.e., scan vector data). For scan test data, the PTSC circuit 618 converts and outputs three (3) streams of serial data—TDO, Mask Data Out (MDO), and Expected Data Out (EDO). TDO is the test data output of the system BIST controller 502 and comprises the source for the TDO of the IEEE 1149.1 bus 512 when the ECE_N signal is de-asserted. The MDO and EDO signals enable the system BIST controller 502 to analyze the actual scan out data returned from the UUT(s). Accordingly, the MDO and EDO signals, as converted by the PTSC circuit 618, are input to the CMP circuit 612. It is noted that the parallel forms of TDO, MDO, and EDO are stored in the FLASH memory 504 as part of the Scan Data 716 (see FIG. 7).

The CMP circuit 612 receives actual scan-out data from the UUT(s) over TDI, and compares this actual data to the expected scan-out data provided over EDO from the PTSC circuit 618. When the scan data "miscompares" (i.e., the compare condition is "false"), a fault in the UUT has been detected and the CMP circuit 612 signals the P_Decode circuit 610, the memory interface 608, and the results interface 604 by de-asserting the Pass/Fail signal. By signaling the P_Decode circuit 610 and the memory interface 608 via the Pass/Fail line that a failure has occurred, the P_Decode circuit 610 and the memory interface 608 are directed to run the Clean-Up Vectors.

The PTSC circuit 618 provides the MDO signal to the CMP circuit 612 to allow the system BIST controller 502 to mask one or more of the expected TDI data bits sent back from the UUT(s). For example, such data may be masked when the expected value for a bit of TDI data is specified to be an "X" (i.e., an indeterminate or unknown logic value). Accordingly, when the MDO signal is asserted in the serial data stream, this signal indicates to the CMP circuit 612 that the result of the corresponding TDO-EDO bit compare is to be ignored, in effect forcing the comparison of the bit to pass.

When DIO data is applied to the UUT(s) over the DIO bus 520, the associated P_Data passes directly from the P_Decode circuit 610, through the data conversion and compare unit 611, and out over the DIO_OUT bus. In the illustrated embodiment, the DIO_OUT bus is selected as the source for the DIO outputs of the system BIST controller 502 when the ECE_N signal is logical high. The system BIST controller 502 can also receive DIO data from the UUT(s). This DIO data from the UUT may be input to the CMP circuit 612 over the DIO_IN bus, and compared using the Expected DIO (EDIO) and Mask DIO (MDIO) inputs to the CMP circuit 612. The EDIO and MDIO inputs are provided as parallel data via the P_Data output of the P_Decode circuit 610.

Results Interface

The results interface 604 reports the outcome of a test or a set of scan vectors, and provides failure and diagnostic information that may be monitored by the user. The results interface 604 has the following inputs and outputs:

TEST_FAIL_N: This output is asserted logical low to indicate that a failure has been detected by the CMP circuit 612 during a test.

SBC_DONE_N: After the system BIST controller 502 is finished running a set of scan vectors, this output is asserted logical low to indicate that the system BIST controller 502 is no longer busy.

Pass/Fail: This input is provided by the CMP circuit 612 to indicate whether the scan vectors passed or failed.

Done: This input is provided by the P_Decode circuit 610 and is asserted when application of the selected scan vectors has completed.

P_Results: The P_Decode circuit 610 provides extended information related to the application of the scan vectors to the results interface 604 over this input bus. For example, the P_Results information may comprise an error code or a text message.

Pass/Fail_Code: The results interface 604 decodes the P_Results information and provides the Pass/Fail_Code output to the memory interface 608. For example, the Pass/Fail_Code may be driven out over the DATA bus for diagnostics purposes when a failure has been detected.

TXD and RXD: These signals comprise Transmit Data (TXD) and Receive Data (RXD), respectively, of a Universal Asynchronous Receiver/Transmitter (UART) port of the system BIST controller 502.

As described above, the results interface 604 receives the Pass/Fail input from the CMP circuit 612 and the Done signal from the P_Decode circuit 610. In the presently disclosed embodiment, the Pass/Fail signal is asserted logical high after the scan vectors are applied if all bits in the scan test compare successfully. If one or more bits in the scan test do not compare successfully, the Pass/Fail signal goes logical low. The results interface 604 drives the SBC_DONE_N and TEST_FAIL_N outputs when the application of the Scan Vector Suite or the Clean-Up Vectors is completed (as indicated by the Done signal).

In the illustrated embodiment, the system BIST controller 502 provides for predetermined (e.g., user defined) codes or text messages to be associated with each of the Scan Vector Suites and Clean-up Vectors. These predetermined codes and text messages are passed to the results interface 604 over the P_Results bus by the P_Decode circuit 610. The results interface 604 uses the P_Results data along with the Pass/Fail status and Done status to provide informational messages, pass/fails codes, or diagnostics to the user. The Pass/Fail_Code is provided by the results interface 604 to the memory interface 608 so that the codes can be driven out over the DATA bus for display purposes. By providing the Pass/Fail_Code to the DATA bus of the memory interface 608, the code may be displayed by, e.g., an LCD or LED display or read by a system processor connected to the DATA bus. In this case, by monitoring the SBC_DONE_N and TEST_FAIL_N outputs, an external system processor can determine when the code being output over the DATA bus is valid. This provides flexibility to the user when utilizing the error codes for diagnosis and repair. In addition to the Pass/Fail_Code, text messages may be provided via the TXD/RXD I/O of the UART port to further aid in diagnosis of failures.

Figure 9:
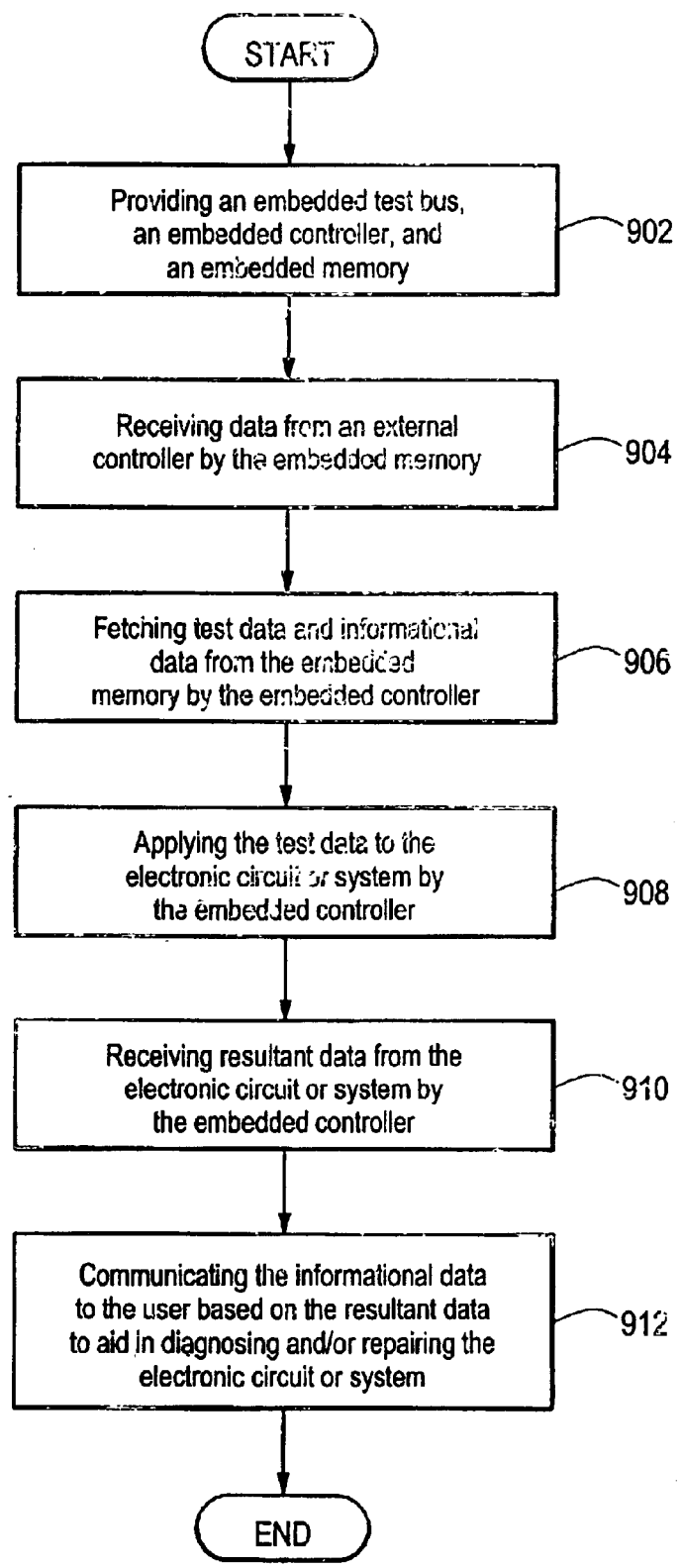
FIG. 9 is a flow diagram illustrating a method of testing, programming, or debugging an electronic circuit or system using the architecture of FIG. 5.

A method of testing, programming, or debugging an electronic circuit or system that includes an embedded BIST circuit according to the present invention is illustrated by reference to FIG. 9. As depicted in step 902, an embedded test bus, an embedded controller, and an embedded memory are provided for the electronic circuit or system. Specifically, the embedded controller is connected to the embedded test bus, and the embedded memory is coupled to the embedded controller. Further, the embedded memory is communicably coupleable to an external controller. The combination of the embedded test bus, the embedded controller, and the embedded memory makes up the embedded BIST circuit for the electronic circuit or system.

Next, data is received, as depicted in step 904, from the external controller by the FLASH memory while the memory is communicably coupled to the external controller. In a preferred embodiment, a "fast access" controller, as described in co-pending U.S. patent application Ser. No. 09/716,583 filed Nov. 20, 2000 entitled METHOD AND APPARATUS FOR PROVIDING OPTIMIZED ACCESS TO CIRCUITS FOR DEBUG, PROGRAMMING, AND TEST, which is incorporated herein by reference, is employed to program the FLASH memory using the external controller. The received data is subsequently used by the embedded controller for testing, programming, or debugging the electronic circuit or system. The embedded memory also receives predetermined (e.g., user definable) informational data associated with the test data from the external controller. This predetermined informational data can be subsequently communicated to the user by the embedded BIST circuit to aid in diagnosis and/or repair of the electronic circuit or system. It is noted that after step 904 is performed, the external controller may be disconnected from the embedded BIST circuit.

The test data and optionally the informational data are then fetched, as depicted in step 906, from the embedded memory by the embedded controller. Next, the test data is applied, as depicted in step 908, to the electronic circuit or system by the embedded controller for testing, programming, or debugging the electronic circuit or system. Resultant data is then received, as depicted in step 910, from the electronic circuit or system by the embedded controller in response to testing, programming, or debugging the electronic circuit or system. Next, at least a portion of the predetermined informational data is communicated, as depicted in step 912, to the user by the embedded BIST circuit based on the resultant data to aid the user in diagnosing and/or repairing the electronic circuit or system.

It will further be appreciated by those of ordinary skill in the art that modifications to and variations of the above-described system BIST controller architecture may be made without departing from the inventive concepts disclosed herein. Accordingly, the invention should not be viewed as limited except as by the scope and spirit of the appended claims.

What is claimed is:

1. A method of embedded serial testing, debugging, or programmably configuring an electronic circuit or system, comprising the steps of:

developing serial input data, serial expected data, and serial mask data by automatic test equipment, the automatic test equipment being communicably coupleable to the electronic circuit or system via an embedded test bus;

storing the serial input data, the serial expected data, and the serial mask data in a memory by the automatic test equipment;

selectively accessing the serial input data, the serial expected data, and the serial mask data from the memory by a serial test controller, the serial test controller being communicably coupleable to the electronic circuit or system via the embedded test bus, the serial test controller being operative to coordinate the testing, debugging, or programmable configuration of the electronic circuit or system;

applying the serial input data to the electronic circuit or system by the serial test controller to test, debug, or programmably configure the electronic circuit or system; and verifying serial output data generated by the electronic circuit or system in response to the serial input data applied thereto by the serial test controller, wherein the serial output data is verified using the serial expected data and the serial mask data selectively accessed by the serial test controller.

2. The method of claim 1 wherein the developing step includes identifying common portion of the serial input data, and creating a respective instance of each identified common data portion.

3. The method of claim 2 wherein the storing step includes storing the respective instances of the identified common data portions in the memory.

4. The method of claim 3 wherein the developing step further includes developing jump data by the automatic test equipment, the jump data corresponding to at least one of the stored instances of the common data portions, and the accessing step includes employing the jump data to access the stored instance of the common data portion from the memory for subsequent application of the common data portion to the electronic circuit or system, thereby enabling multiple non-sequential sequential accesses of the respective common data portions from the memory by the serial test controller.

5. The method of claim 4 wherein the accessing step further includes employing the jump data to access at least one of the stored instances of the common data portions in response to a predetermined condition.

6. The method of claim 1 further including the step of accessing informational data by the serial test controller in response to the verification of the serial output data for subsequent use in aiding diagnosis or repair of the electronic circuit or system.

7. The method of claim 6 wherein the informational data includes at least one predetermined diagnostic code or text message.

8. The method of claim 7 further including the step of, in the event the serial output data fails to be successfully verified, displaying the at least one predetermined diagnostic code or text message.

9. The method of claim 1 wherein the accessing step includes accessing the serial expected data from the memory, and wherein the verifying step includes comparing the serial output data with the serial expected data.

10. The method of claim 1 wherein the accessing step includes accessing the serial expected data and the serial mask data from the memory, and wherein the verifying step includes masking at least a portion of the serial output data with the serial mask data, and comparing the masked serial output data with the serial expected data.

11. The method of claim 1 further including the step of, in the event the serial output data is successfully verified, providing an indication of the successful data verification.

12. The method of claim 1 further including the step of, in the event the verifying step is completed, providing an indication of the completion of data verification.

13. The method of claim 1 further including the step of receiving at least one input signal by the serial test controller, the input signal being operative to start or to initiate a controlled stop of the application of the serial input data to the electronic circuit or system.

14. The method of claim 13 wherein the receiving step includes receiving at least one input signal by the serial test controller, the input signal being received from a human operator.

15. The method of claim 13 wherein the receiving step includes receiving at least one input signal in response to at least one event occurring during the application of the serial input data to the electronic circuit or system by the serial test controller, the input signal being operative to initiate a controlled stop of the application of the serial input data.

16. The method of claim 1 wherein the developing step includes developing the serial input data, the serial expected data, and the serial mask date by the automatic test equipment, the automatic test equipment being communicably coupleable to the electronic circuit or system via the serial test controller.

17. The method of claim 1 further including the step of sensing a power-up condition by the serial test controller, and in the event the power-up condition is sensed, performing the accessing and applying steps.

18. The method of claim 1 wherein the developing step further comprises developing a star address table including a plurality of start addresses, each start address being indicative of the start address of a respective partition of the serial input data stored in the memory.

19. The method of claim 18 further including the step of receiving at least one input signal by the serial test controller, the input signal being indicative of at least one of the start addresses included in the start address table, and wherein the accessing step includes accessing the data partition corresponding to the start address indicated by the input signal for subsequent application to the electronic circuit or system.

20. The method of claim 1 wherein the developing step includes developing clean-up data by the automatic test equipment, the clean-up data being operative to place the electronic circuit or system in a predetermine state.

21. The method of claim 20 wherein the applying step includes applying the clean-up data to the electronic circuit or system by the serial test controller after completing the testing, debugging, or programmable configuration of the electronic circuit or system.

22. The method of claim 20 wherein the applying step includes applying the clean-up data to the electronic circuit or system in the event a stop or failure condition is detected by the serial test controller.

23. The method of claim 20 wherein the applying step includes applying the clean-up data to the electronic circuit or system in the event a predetermined input signal is received by the serial test controller.

24. The method of claim 1 wherein the verifying step includes performing a bit level comparison of the signal output data with the serial expected data.

25. The method of claim 24 wherein the verifying step further includes masking one or more bits of the serial output data using the serial mask data.

26. The method of claim 1 wherein the serial input data, the serial expected data, and the serial mask data conform to a predetermined data format, wherein the embedded test bus conforms to a predetermined data communications protocol, and wherein the applying step includes applying the serial input data in the predetermined data format using the predetermined communications protocol of the embedded test bus.

27. A system for embedded serial testing, debugging, or programmably configuring an electronic circuit or system, comprising:
   an embedded test bus communicably connectable to the electronic circuit or system and to automatic test equipment,;
   a serial test controller communicably coupleable to the electronic circuit or system via the embedded test bus; and
   a memory, coupled to the serial test controller and communicably connectable to the automatic test equipment, wherein the automatic test equipment is configured to develop serial input data, serial expected data, and serial mask data, and to store the serial input data, the serial expected data, and the serial mask data in the memory, and
   wherein the serial test controller is configured to selectively access the serial input data, the serial expected data, and the serial mask data from the memory, to apply the serial input data to the electronic circuit or system to test, debug, or programmably configure the electronic circuit or system, and to verify serial output data generated by the electronic circuit or system in response to the applied serial input data using the serial expected data and the serial mask data.

28. The system of claim 27 wherein the automatic test equipment is further configured to identify common portions of the serial input data, and to create a respective instance of each identified common data portion.

29. The system of claim 28 wherein the automatic test equipment is further configured to store the respective instances of the identified common data portions in the memory.

30. The system of claim 29 wherein the automatic test equipment is further configured to develop jump data, the jump data corresponding to at least one of the instances of the common data portions, and the serial test controller is further configured to employ the jump data to access the instance of the common data portion for subsequent application of the common data portion to the electron circuit or system, thereby enabling multiple non-sequential accesses of the respective common data portions from the memory by the serial test controller.

31. The system of claim 30 wherein the serial test controller is further configured to employ the jump data to access at least one of the instances of the common data portions in response to a predetermined condition.

32. The system of claim 27 wherein the serial test controller is further configured to access informational data in response to the verification of the serial output data for subsequent use in aiding diagnosis or repair of the electronic circuit or system.

33. The system of claim 32 wherein the informational data includes at least one predetermined diagnostic code or text message.

34. The system of claim 33 wherein the serial test controller is further configured, in the event the serial output data fails to be successfully verified, to provide the at least one predetermined diagnostic code or text message as an indication of the data verification failure.

35. The system of claim 27 wherein the serial test controller is further configured to access the serial expected data from the memory, and to compare the serial output data with the serial expected data.

36. The system of claim 27 wherein the serial test controller is further configured to access the serial expected data and the serial mask data from the memory, to mask at least a portion of the serial output data with the serial mask data, and to compare the masked serial output data with the serial expected data.

37. The system of claim 27 wherein the serial test controller is further configured, in the vent the serial output data is successfully verified, to provide an indication of the successful data verification.

38. The system of claim 27 wherein the serial test controller is further configured, in the event the verifying step is completed, to provide an indication of the completion of data verifications.

39. The system of claim 27 wherein the serial test controller is further configured to receive at least one input signal, the input signal being operative to start or to initiate a controlled stop of the application of the serial input data to the electronic circuit or system.

40. The system of claim 39 wherein the serial test controller is further configured to receive the input signal from a human operator.

41. The system of claim 39 wherein the serial test controller is further configured to receive the input signal operative to initiate a controlled stop of the application of the serial input data in response to at least one event occurring during the application of the serial input data to the electronic circuit or system.

42. The system of claim 27 wherein the automatic test equipment is communicably coupleable to the electronic circuit or system via the serial test controller.

43. The system of claim 27 wherein the serial test controller is further configured to sense power-up condition, and in the event the power-up condition is sensed, to access the serial input data from the memory, and to apply the serial input data to the electronic circuit or system.

44. The system of claim 27 wherein a communications protocol of the embedded test bus is the IEEE 1149.1 test standard protocol.

45. The system of claim 27 wherein the embedded test bus comprises a plurality of embedded test buses.

46. The system of claim 45 wherein the plurality of embedded test buses includes at least on embedded digital test bus.

47. The system of claim 45 wherein a communications protocol of at least one of the plurality of embedded test buses is the IEEE 1149.1 test standard protocol.

48. The system of claim 45 wherein a communications protocol of at least one of the plurality of embedded test buses is the IEEE 1149.4 test standard protocol.

49. The system of claim 27 wherein the automatic test equipment is further configured to develop a start address table including a plurality of start addresses, each start address being indicative of the start address of a respective partition of the serial input data stored in the memory.

50. The system of claim 49 wherein the serial test controller is further configured to receive at least one input signal, the input signal being indicative of at least one of the start addresses included in the start address table, and to access the data partition corresponding to the start address indicated by the input signal for subsequent application to the electronic circuit or system.

51. The system of claim 27 wherein the automatic test equipment is further configured to develop clean-up data, the clean-up data being operative to place the electronic circuit or system in a predetermined state.

52. The system of claim 51 wherein the serial test controller is further configured to apply the clean-up data to the electronic circuit or system after completing the testing, debugging, or programmable configuration of the electronic circuit or system.

53. The system of claim 51 wherein the serial test controller is further configured to apply the clean-up data to the electronic circuit or system in the event a stop or failure condition is detected by the serial test controller.

54. The system of claim 51 wherein the serial test controller is further configured to apply the clean-up data to the electronic circuit or system in the event a predetermined input signal is received by the serial test controller.

55. The system of claim 27 wherein the serial test controller is further configured to perform a bit level comparison of the serial output data with the serial expected data.

56. The system of claim 55 wherein the serial test controller is further configured to mask one or more bits of the serial output data using the serial mask data.

57. The system of claim 27 wherein the embedded test bus conforms to a predetermined data communications protocol, wherein the serial input data, the serial expected data, and the serial mask data conform to a predetermined data format, and wherein the serial test controller is configured to apply the serial input data in the predetermined data format using the predetermined communications protocol of the embedded test bus.

58. A method of design for test (DFT) of an electronic circuit or system, comprising the steps of
providing automatic test equipment configured to develop serial input data, serial expected data, and serial mask data for subsequent use in testing, debugging, or programmably configuring the electronic circuit or system,;
embodying within the electronic circuit or system a test bus, the test bus being communicably connectable to the automatic test equipment and the electronic circuit or system, the automatic test equipment being further configured to control the test bus while developing the serial input data, the serial expected data, and the serial mask data;
embodying within the electronic circuit or system a memory communicably connectable to the automatic test equipment, the automatic test equipment being further configured to store the serial input data, the serial expected data, and the serial mask data in the memory; and
embodying within the electronic circuit or system a serial test controller, the serial test controller being coupled to the memory and communicably connectable to the test bus, the serial test controller being configured to selectively access the serial input data, the serial expected data, and the serial mask data from the memory, to control the test bus for applying the serial input data to the electronic circuit or system, and to verify serial output data generated by the electronic circuit or system in response to the applied serial input data using the serial expected data and the serial mask data.

59. The method of DFT of claim 58 wherein the automatic test equipment is configured to identify common portions of the data, and to create a respective instance of each identified common data portion.

60. The method of DFT of claim 59 wherein the automatic test equipment is further configured to store the respective instances of the identified common data portions in the memory.

61. The method of DFT of claim 60 wherein the automatic test equipment is further configured to develop jump data, the jump data corresponding to at least one of the instances of the common data portions, and the serial test controller is further configured to employ the jump data to access the instance of the common data portion for a subsequent application of the common data portion to the electronic circuit or system, thereby enabling multiple non-sequential accesses of the respective common data portions from the memory by the serial test controller.

62. The method of DFT of claim 61 wherein the serial test controller is further configured to employ the jump data to access at least one of the instances of the common data portions in response to a predetermined condition.

63. The method of DFT of claim 58 wherein the serial test controller is further configured to access informational data in response to the verification of the serial output data for subsequent use in aiding diagnosis or repair of the electronic circuit or system.

64. The method of DFT of claim 63 wherein the informational data includes at least one predetermined diagnostic code or text message.

65. The method of DFT of claim 64 wherein the serial test controller is further configured, in the event the serial output data fails to be successfully verified, to provide the at least one predetermined diagnostic code or text message as an indication of the data verification failure.

66. The method of DFT of claim 58 wherein the serial test controller is further configured to access the serial expected data from the memory, and to compare the serial output data with the serial expected data.

67. The method of DFT of claim 58 wherein the serial test controller is further configured to access the serial expected data and the serial mask data from the memory, to mask at least a portion of the serial output data with the serial mask data, and to compare the masked serial output data with the serial expected data.

68. The method of DFT of claim 58 wherein the serial test controller is further configured, in the event the serial output data is successfully verified, to provide an indication of the successful data verification.

69. The method of DFT of claim 58 wherein the serial test controller is further configured, in the event the data verification is completed, to provide an indication of the completion of data verification.

70. The method of DFT of claim 58 wherein the third embodying step includes embodying within the electronic circuit or system the serial test controller, the serial test controller being further configured to receive at least one input signal, the input signal being operative to start or to initiate controlled stop of the application of the serial input data to the electronic circuit or system.

71. The method of DFT of claim 70 wherein the serial test controller is further configured to receive at least one input signal, the input signal being received from a human operator.

72. The method of DFT of claim 70 wherein the serial test controller is further configured to receive at least one input signal in response to at least one event occurring during the application of the serial input data to the electronic circuit or system, the input signal being operative to initiate a controlled stop of the application of the serial input data.

73. The method of DFT of claim 58 wherein the providing step includes providing the automatic test equipment, the automatic test equipment being communicably coupleable to the electronic circuit or system via the serial test controller.

74. The method of DFT of claim 58 wherein the third embodying step includes embodying within the electronic circuit or system the serial test controller, the serial test controller being configured to sense a power-up condition, and, in the event the power-up condition is sensed, to access the serial input data from the memory, and to control the test bus for applying the serial input data to the electronic circuit or system.

75. The method of DFT of claim 58 wherein the providing step includes providing the automatic test equipment, the automatic test equipment being configured to develop a start address table including a plurality of start addresses, each start address being indicative of the start address of a respective partition of the serial input data stored in the memory.

76. The method of DFT of claim 75 wherein the serial test controller is further configured to receive at least one input signal, the input signal being indicative of at least one of the start addresses included in the start address table, and to access the data partition corresponding to the start address indicated by the input signal for subsequent application to the electronic circuit or system.

77. The method of DFT of claim 58 wherein the providing step includes providing the automatic test equipment, the automatic test equipment being configured to develop clean-up data, the clean-up data being operative to place the electronic circuit or system in a predetermined state.

78. The method of DFT of claim 77 wherein the serial test controller is further configured to apply the clean-up data to the electronic circuit or system after completing the testing, debugging, or programmable configuration of the electronic circuit or system.

79. The method of DFT of claim 77 wherein the serial test controller is further configured to apply the clean-up data to the electronic circuit or system in the event a stop or failure condition is sensed by the serial test controller.

80. The method of DFT of claim 77 wherein the serial test controller is further configured to apply the clean-up data to the electronic circuit or system in the event a predetermined input signal is received by the serial test controller.

81. The method of DFT of claim 58 wherein the serial input data, the serial expected data, and the serial mask data conform to a predetermined date format, the test bus conforms to a predetermined communications protocol, and the serial input data is supplied in the predetermined data format using the predetermined communications protocol of the test bus.

82. A method of serial testing, debugging, or programmably configuring an electronic circuit or system, comprising the steps of:

accessing first serial input data at a first predetermined memory location by a serial test controller;

applying the first serial input data to the electronic circuit or system by the serial test controller to test, debug, or programmably configure the electronic circuit or system;

receiving serial output data by the serial test controller, the serial output data being generated by the electronic circuit or system in response to the first serial input data applied thereto;

comparing the serial output data with serial expected data by the serial test controller;

in the event the serial output data matches the serial expected data, accessing second serial input data at second predetermined memory location by the serial test controller;

in the event the serial output data fails to match the serial expected data, accessing third serial input data at a third predetermined memory location by the serial test controller; and applying the serial input data accessed in the second or third accessing steps to the electronic circuit or system by the serial test controller to test, debug, or programmably configure the electronic circuit or system.

83. A method of embedded serial testing, debugging, or programmably configuring an electronic circuit or system, comprising the steps of:

developing serial input data, serial expected data, and serial mask data by automatic test equipment the automatic test equipment being communicably coupleable to the electronic circuit or system via an embedded test bus, the serial input data conforming to a predetermined serial object format;

storing the serial input data, the serial expected data, and the serial mask data in a memory by the automatic test equipment;

selectively accessing the serial input data, the serial expected data, and the serial mask data from the memory by a serial test controller, the serial test controller being communicably coupleable to the electronic circuit or system via the embedded test bus, the serial test controller being operative to coordinate the testing, debugging, or programmable configuration of the electronic circuit or system;

applying the serial input data to the electronic circuit or system by the serial test controller to test, debug, or programmably configure the electronic circuit or system; and verifying serial output data generated by the electronic circuit or system in response to the serial input data applied thereto by the serial test controller, the serial output data being verified using the serial expected data and the serial mask data selectively accessed by the serial test controller, wherein the developing step includes operating the automatic test equipment in accordance with the predetermined serial object format, and wherein the applying and verifying steps include operating the serial test controller in accordance with the predetermined serial object format.

* * * * *

UNITED STATES PATENT AND TRADEMARK OFFICE
CERTIFICATE OF CORRECTION

| | | |
|---|---|---|
| PATENT NO. | : 6,957,371 B2 | Page 1 of 1 |
| APPLICATION NO. | : 10/142556 | |
| DATED | : October 18, 2005 | |
| INVENTOR(S) | : Michael Ricchetti et al. | |

It is certified that error appears in the above-identified patent and that said Letters Patent is hereby corrected as shown below:

Column 9, line 8, "$Test_{13}Select$" should read --Test_Select--;

Column 18, line 61, claim 37, "vent" should read --event--;

Column 20, line 56, claim 61, delete "a";

Column 22, line 26, claim 81, "date" should read --data--; and

Column 22, line 28, claim 81, "supplied" should read --applied--.

Signed and Sealed this

Sixth Day of February, 2007

JON W. DUDAS
*Director of the United States Patent and Trademark Office*